United States Patent
Chae et al.

(10) Patent No.: US 7,773,018 B2
(45) Date of Patent: Aug. 10, 2010

(54) SIGMA-DELTA ANALOG-TO-DIGITAL CONVERTER AND SOLID-STATE IMAGE PICKUP DEVICE

(75) Inventors: Youngcheol Chae, Seoul (KR); In Hee Lee, Seoul (KR); Gunhee Han, Seoul (KR); Seog Heon Ham, Suwon-si (KR)

(73) Assignees: Samsung Electronics Co., Ltd., Gyeonggi-do (KR); Industry-Academic Cooperation Foundation Yonsei University, Seoul (KR)

( * ) Notice: Subject to any disclaimer, the term of this patent is extended or adjusted under 35 U.S.C. 154(b) by 0 days.

(21) Appl. No.: 12/453,845

(22) Filed: May 26, 2009

(65) Prior Publication Data

US 2009/0289823 A1   Nov. 26, 2009

(30) Foreign Application Priority Data

May 23, 2008   (KR) ..................... 10-2008-0048127

(51) Int. Cl.
*H03M 3/00* (2006.01)
(52) U.S. Cl. ...................................... 341/143; 384/294
(58) Field of Classification Search .......... 341/143–155
See application file for complete search history.

(56) References Cited

U.S. PATENT DOCUMENTS

| | | | |
|---|---|---|---|
| 5,886,659 A | 3/1999 | Pain et al. | |
| 6,351,501 B1 * | 2/2002 | Murdock | 375/292 |
| 6,788,233 B1 * | 9/2004 | Quiquempoix et al. | 341/143 |
| 6,847,312 B2 * | 1/2005 | Lenz et al. | 341/50 |
| 7,215,269 B2 | 5/2007 | Lee et al. | |
| 7,432,834 B1 * | 10/2008 | Cideciyan et al. | 341/59 |
| 7,535,387 B1 * | 5/2009 | Delva | 341/107 |
| 2006/0232676 A1 | 10/2006 | Boemler | |

FOREIGN PATENT DOCUMENTS

KR   10-2007-0021836   2/2007

* cited by examiner

*Primary Examiner*—Lam T Mai
(74) *Attorney, Agent, or Firm*—Harness, Dickey & Pierce, P.L.C.

(57) ABSTRACT

A sigma-delta analog-to-digital converter may include a sigma-delta modulator and a decimation filter. The sigma-delta modulator may convert a first analog input signal into a first bit stream having a first pattern using sigma-delta modulation and convert a second analog input signal into a second bit stream having a second pattern using the sigma-delta modulation. The decimation filter may integrate the number of bits having a particular value in the first bit stream, output a first digital value, calculate a bitwise complement value of the first digital value, integrate the number of bits having the particular value in the second bit stream with the bitwise complement value of the first digital value as an initial value of a second digital value, and output the second digital value.

14 Claims, 7 Drawing Sheets

SIGMA-DELTA ANALOG-TO-DIGITAL CONVERTER AND SOLID-STATE IMAGE PICKUP DEVICE

FOREIGN PRIORITY STATEMENT

This application claims priority under 35 U.S.C. §119 to Korean Patent Application No. 10-2008-0048127 filed on May 23, 2008, in the Korean Intellectual Property Office (KIPO), the entire contents of which are incorporated herein by reference.

BACKGROUND

1. Field

Example embodiments relate to a signal processing device, and more particularly, to a high-resolution sigma-delta analog-to-digital converter and an image pickup device including the same.

2. Description of the Related Art

Since analog signal processing may be more difficult than digital signal processing, a solid-state image pickup device, for example, a complementary metal-oxide semiconductor (CMOS) imager or a CMOS image sensor, may convert an analog pixel signal output from a pixel array into a digital signal using an analog-to-digital converter (ADC). In addition, the solid-state image pickup device may use a column-parallel ADC in order to convert an analog pixel signal into a digital signal in units of columns of the pixel array. The performance of an ADC may depend on the degree of accuracy of converting an analog pixel signal into a digital signal.

SUMMARY

Example embodiments provide a sigma-delta analog-to-digital converter for providing high-resolution digital outputs and an image pickup device including the same.

Example embodiment provide a sigma-delta analog-to-digital converter which may include a sigma-delta modulator configured to convert a first analog input signal into a first bit stream having a first pattern using sigma-delta modulation and convert a second analog input signal into a second bit stream having a second pattern using the sigma-delta modulation; and a decimation filter configured to integrate the number of bits having a particular value in the first bit stream, output a first digital value, calculate a bitwise complement value of the first digital value, integrate the number of bits having the particular value in the second bit stream with the bitwise complement value of the first digital value as an initial value of a second digital value, and output the second digital value. The first analog input signal may be a reset signal output from a pixel and the second analog input signal may be an image signal output from the pixel.

The decimation filter may include an integrator configured to output the first digital value and the second digital value and a complement value calculation circuit configured to calculate the bitwise complement value from the first digital value output from the integrator. The integrator may set the bitwise complement value output from the complement value calculation circuit as the initial value of the second digital value before integrating the number of bits having the particular value in the second bit stream. The order of the decimation filter may be the same as or greater than the order of the sigma-delta modulator.

Example embodiments provide a sigma-delta analog-to-digital converter which may include a sigma-delta modulator configured to convert a first analog input signal into a first bit stream having a first pattern using sigma-delta modulation and convert a second analog input signal into a second bit stream having a second pattern using the sigma-delta modulation; and a decimation filter configured to generate a first digital value by integrating the number of bits having a particular value in the first bit stream, generate a second digital value by integrating the number of bits having the particular value in the second bit stream, and generate a third digital value corresponding to a difference between the second digital value and the first digital value.

The decimation filter may include an integrator configured to generate the first digital value and the second digital value, a memory configured to store the first digital value output from the integrator, and an arithmetic circuit configured to generate the third digital value corresponding to the difference between the second digital value output from the integrator and the first digital value output from the memory.

Example embodiments provide an image pickup device which may include the sigma-delta analog-to-digital converter and a pixel unit comprising a plurality of pixels. The first analog input signal may be a reset signal output from the pixel unit and the second analog input signal may be an image signal output from the pixel unit.

Example embodiments provide a sigma-delta analog-to-digital conversion method which may include converting a first analog input signal into a first bit stream having a first pattern using a sigma-delta modulator, integrating the number of bits having a particular value in the first bit stream and outputting a first digital value using a decimation filter, calculating a bitwise complement value of the first digital value using the decimation filter, converting a second analog input signal into a second bit stream having a second pattern using the sigma-delta modulator, and integrating the number of bits having the particular value in the second bit stream with the bitwise complement value as an initial value and outputting a second digital value using the decimation filter.

Example embodiments provide a sigma-delta analog-to-digital conversion method which may include converting a first analog input signal into a first bit stream having a first pattern using a sigma-delta modulator, integrating the number of bits having a particular value in the first bit stream and outputting a first digital value using a decimation filter, storing the first digital value using a memory, converting a second analog input signal into a second bit stream having a second pattern using the sigma-delta modulator, integrating the number of bits having a particular value in the second bit stream and outputting a second digital value using the decimation filter, and outputting a third digital value corresponding to a difference between the second digital value and the first digital value stored in the memory.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
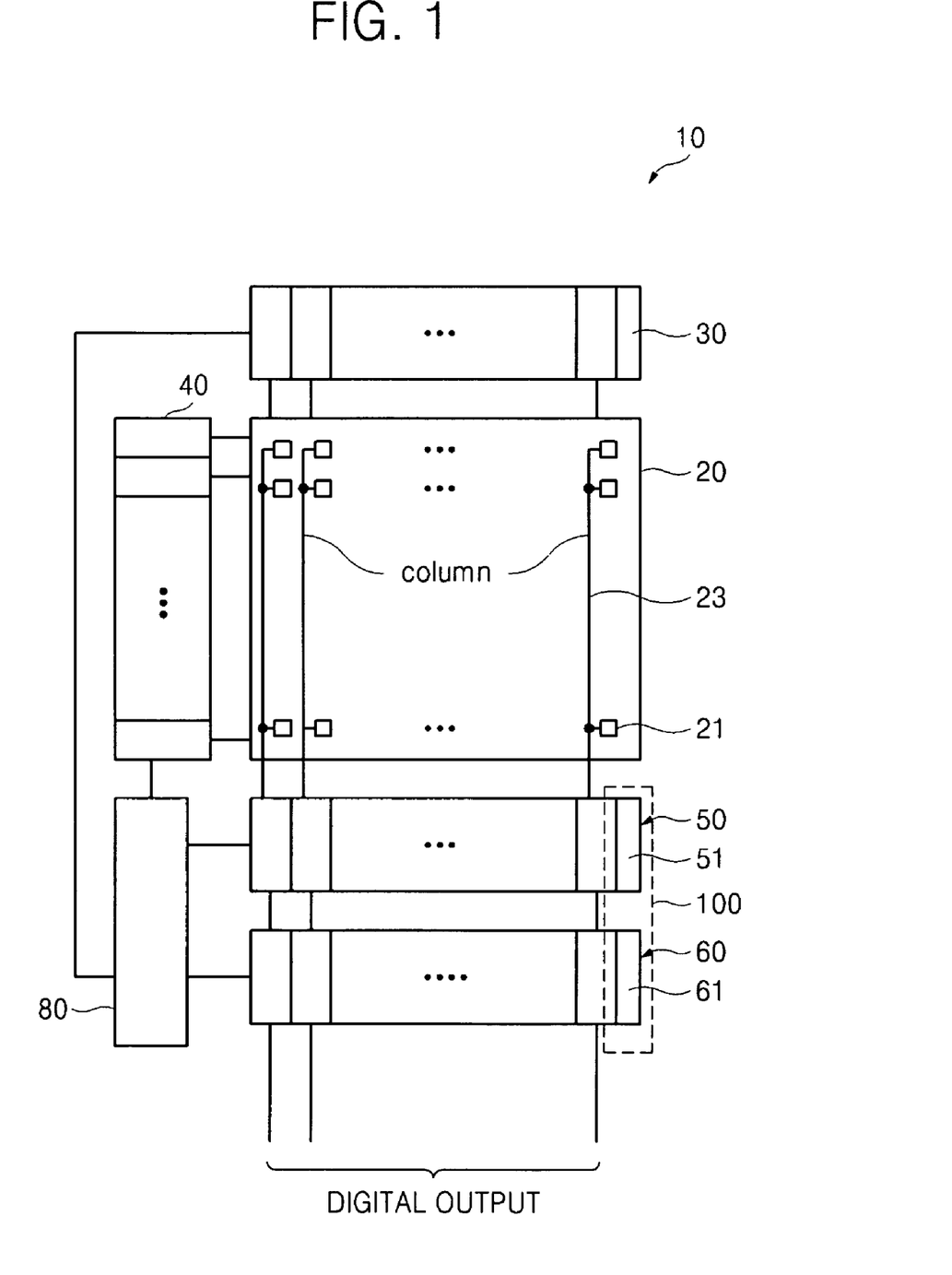
FIG. 1 is a block diagram of an image pickup device including a column-parallel sigma-delta analog-to-digital converter (ADC) according to example embodiments.

FIG. 1 is a block diagram of an image pickup device 10 including a column-parallel sigma-delta analog-to-digital converter (ADC) 100 according to example embodiments. The image pickup device 10, which may pick up an image and may be included in, for example, a digital camera or a mobile phone equipped with a camera, may include a pixel array 20 including a plurality of pixel units 21. Each of the pixel units 21 may include at least one pixel which may include a photoelectric converter, for example a photodiode or a phototransistor, and a plurality of transistors transmitting a signal from the photoelectric converter to output the signal from the pixel array 20.

Analog pixel signals, for example, a reset signal and an image signal, output from a pixel unit 21 selected by a horizontal scanning circuit 30 and a vertical scanning circuit 40 may be transmitted to a sigma-delta modulation block 50 through a pixel column (or a vertical signal line) 23. The sigma-delta modulation block 50 may include a plurality of sigma-delta modulators 51 respectively connected with the pixel columns 23. The sigma-delta modulators 51 may be referred to as delta-sigma modulators. At least one of the pixel units 21 may be connected to each pixel column 23.

A single sigma-delta modulator 51 may be connected with a single pixel column 23. Accordingly, each of the sigma-delta modulators 51 may convert an analog pixel signal output from a pixel column 23 connected thereto into a bit stream using sigma-delta modulation. The bit stream may be an m-bit stream where "m" may be a real number, for example, m=1 or 1.5. A decimation filter block 60 may include a plurality of decimation filters 61. Each of the decimation filters 61 may process or decimate the m-bit stream output from one of the sigma-delta modulators 51 and output a decimated digital value. The digital value may be a K-bit digital signal where "K" is a natural number. Each decimation filter 61 may be an embodiment of a digital filter.

A timing generation circuit 80 may generate various timing signals needed to control the operations of the elements 20, 30, 40, 50, and 60 and output the timing signals to the elements 20, 30, 40, 50, and 60. One of the sigma-delta modulators 51 and one of the decimation filters 61 may form a single column-parallel sigma-delta ADC 100.

Figure 2:
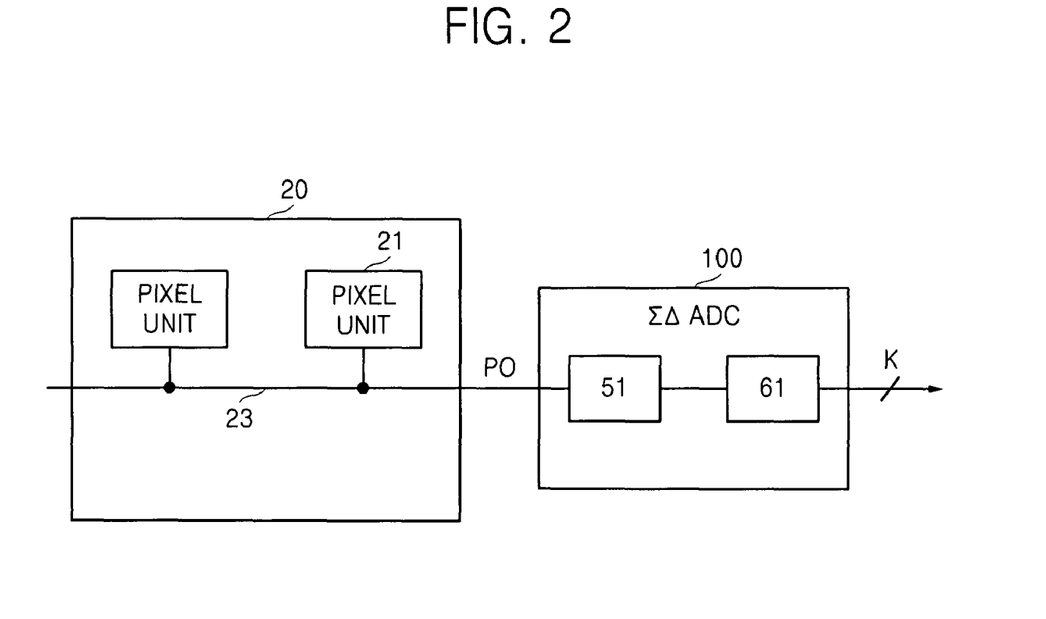
FIG. 2 is a block diagram of a pixel array and the column-parallel sigma-delta ADC according to example embodiments.
Figure 3:
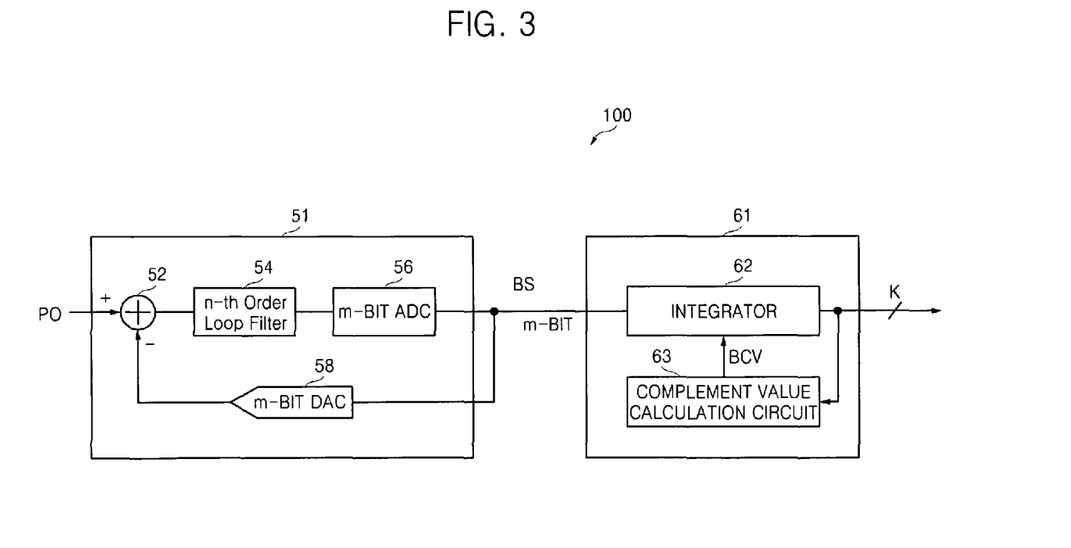
FIG. 3 is a block diagram of the sigma-delta ADC according to example embodiments.
Figure 6:
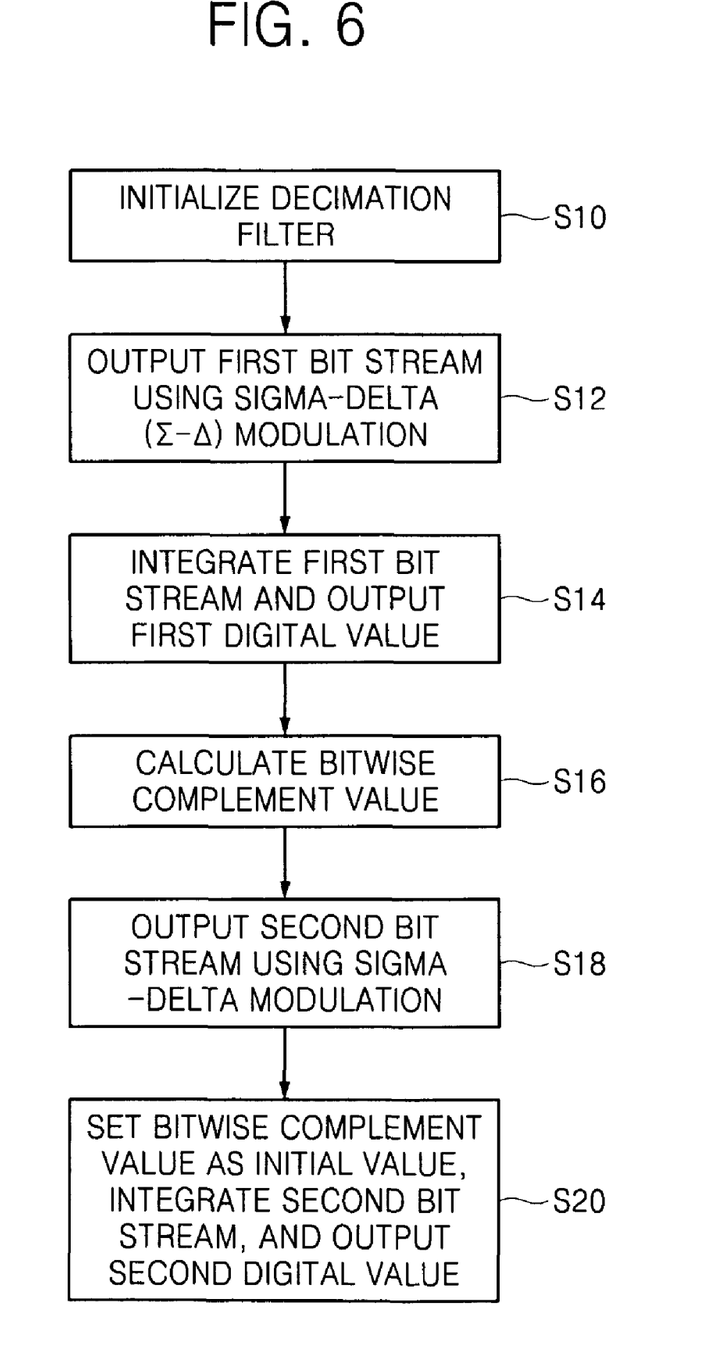
FIG. 6 is a flowchart of the operations of the sigma-delta ADC illustrated in FIG. 3.

FIG. 2 is a block diagram of the pixel array 20 and the column-parallel sigma-delta ADC 100 according to example embodiments. FIG. 3 is a block diagram of the sigma-delta ADC 100 according to example embodiments. FIG. 6 is a flowchart of the operations of the sigma-delta ADC 100 illustrated in FIG. 3. An analog pixel signal PO output from a pixel unit 21, which may include a plurality of pixels, may be transmitted to the sigma-delta ADC 100 through a pixel column 23. The sigma-delta ADC 100 may include a sigma-delta modulator 51 and a decimation filter 61. The sigma-delta modulator 51 may convert the analog pixel signal PO into an m-bit stream BS using sigma-delta modulation.

A subtractor 52 included in the sigma-delta modulator 51 may calculate a difference between the analog pixel signal PO and an analog feedback signal output from an m-bit digital-to-analog converter (DAC) 58. At this time, the analog pixel signal PO may be an oversampled analog pixel signal. The subtractor 52 may be replaced by an adder having a negative (−) input terminal.

An nth-order integrator 54 (where "n" is a natural number) may integrate the difference output from the subtractor 52 and generate an integration signal. An m-bit ADC 56 may convert the integration signal output from the nth-order integrator 54 into a digital signal, i.e., the bit stream BS. For instance, the m-bit ADC 56 may be implemented by a quantizer or a comparator. At this time, when "n" is 1, "m" may be 1, or when "n" is 2, "m" may be 1.5. The order of the decimation filter 61 may be the same as or greater than the order of the sigma-delta modulator 51. For example, when the sigma-delta modulator 51 is a second-order modulator, the decimation filter 61 may be a second- or higher-order filter; or when the sigma-delta modulator 51 is a third-order modulator, the decimation filter 61 may be a third- or higher-order filter.

The operations of the sigma-delta ADC 100 will be described with reference to FIGS. 2, 3, and 6 on the assumption that a digital value generated by integrating the number of bits having a particular value (e.g., 1) in a first bit stream BS having a first pattern, e.g., "0111", is 6 and a digital value generated by integrating the number of bits having a particular value (e.g., 1) in a second bit stream BS having a second pattern, e.g., "1110", is 9. An integrator 62 included in the decimation filter 61 may be initialized to "0" in response to an initialization signal input from outside the decimation filter 61 in operation S10. The initialization signal may be generated by a complement value calculation circuit 63 or another signal generator. The integrator 62 may be implemented by a counter or an arithmetic circuit having an adding function. In addition, it may be sufficient if the integrator is initialized before integrating the number of bits having the particular value (e.g., 1) in the first bit stream BS having the first pattern, e.g., "0111".

The sigma-delta modulator 51 may convert a reset signal output from the pixel unit 21 into the first bit stream BS having the first pattern, e.g., "0111", using sigma-delta modulation in operation S12. The integrator 62 of the decimation filter 61 may integrate the number of bits having the particular value (e.g., 1) in the first bit stream BS having the first pattern, e.g., "0111", and outputs a first digital value (e.g., 6) as the result of the integration in operation S14.

The complement value calculation circuit 63 included in the decimation filter 61 may calculate a bitwise complement value BCV (e.g., −6 or a digital value representing −6) from the first digital value (e.g., 6 or a digital value representing 6) in operation S16. The integrator 62 of the decimation filter 61 may receive the bitwise complement value BCV (e.g., −6) from the complement value calculation circuit 63 and set the bitwise complement value BCV as an initial value. The sigma-delta modulator 51 may convert an image signal output from the pixel unit 21 into the second bit stream BS having the second pattern, e.g., "1110", using sigma-delta modulation in operation S18.

The integrator 62 of the decimation filter 61 may integrate the number of bits having the particular value (e.g., 1) in the second bit stream BS having the second pattern, e.g., "1110", with the bitwise complement value BCV (e.g., −6) as the initial value and output a second digital value (e.g., −6+9=3) in operation S20. As described above with reference to FIGS. 3 and 6, the decimation filter 61 may perform correlated double sampling and decimation simultaneously.

Figure 5:
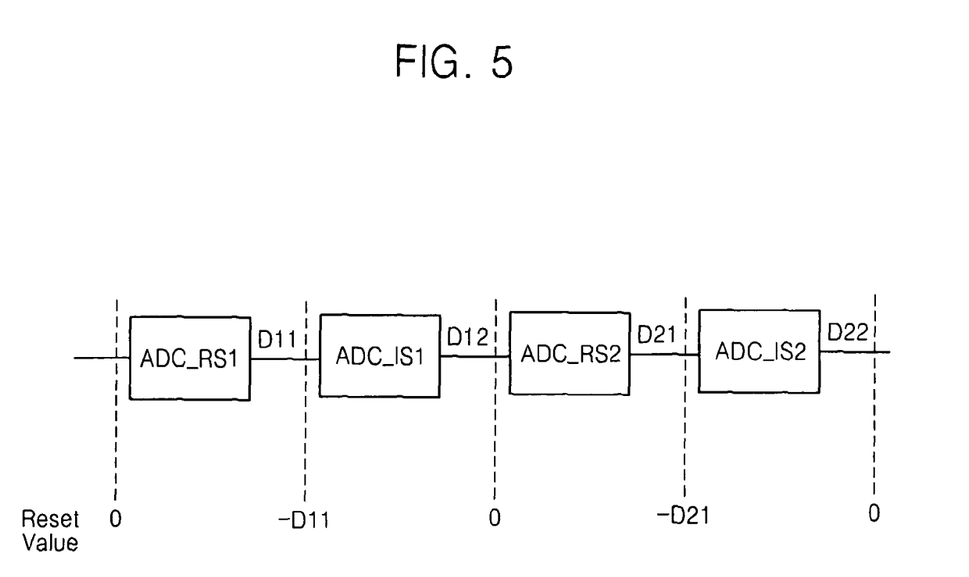
FIG. 5 is a timing chart conceptually illustrating the operations of a sigma-delta ADC including a sigma-delta modulator and a decimation filter according to example embodiments.

FIG. 5 is a timing chart conceptually illustrating the operations of a sigma-delta ADC including the sigma-delta modulator 51 and the decimation filter 61 according to example embodiments. Before a reset signal output from a first pixel connected to a B-th row or line (where B is a natural number) connected with the pixel column 23 is subjected to analog-to-digital conversion ADC_RS1, the integrator 62 may be initialized to "0". Thereafter, the integrator 62 may perform the analog-to-digital conversion ADC_RS1 on the reset signal and output a first digital value D11 as the conversion result. Before an image signal output from the first pixel is subjected to analog-to-digital conversion ADC_IS1, the integrator 62 may set a complement value −D11 of the first digital value D11 as an initial value. Thereafter, the integrator 62 may perform the analog-to-digital conversion ADC_IS1 on the image signal with the complement value −D11 as the initial value and output a second digital value D12 as the conversion result.

Continuously, before a reset signal output from a second pixel connected to a (B+1)-th row or line connected with the pixel column 23 is subjected to analog-to-digital conversion ADC_RS2, the integrator 62 may be initialized to "0". Thereafter, the integrator 62 may perform the analog-to-digital conversion ADC_RS2 on the reset signal and output a third digital value D21 as the conversion result. Before an image signal output from the second pixel is subjected to analog-to-digital conversion ADC_IS2, the integrator 62 may set a complement value −D21 of the third digital value D21 as an initial value. Thereafter, the integrator 62 may perform the analog-to-digital conversion ADC_IS2 on the image signal with the complement value −D21 as the initial value and output a fourth digital value D22 as the conversion result.

As described above with reference to FIGS. 3, 5, and 6, for each line, the integrator 62 of the decimation filter 61 may be initialized to "0" before performing analog-to-digital conversion on a reset signal and may set a complement value of a digital signal generated as a result of performing the analog-to-digital conversion on the reset signal as an initial value before performing analog-to-digital conversion on an image signal. Accordingly, the decimation filter 61 may perform correlated double sampling.

Figure 4:
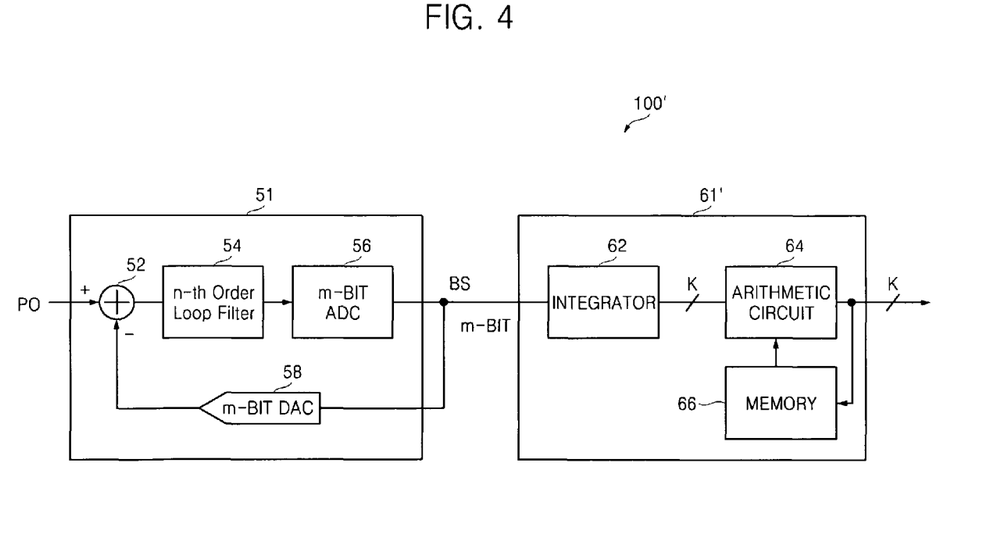
FIG. 4 is a block diagram of a sigma-delta ADC according to example embodiments.
Figure 7:
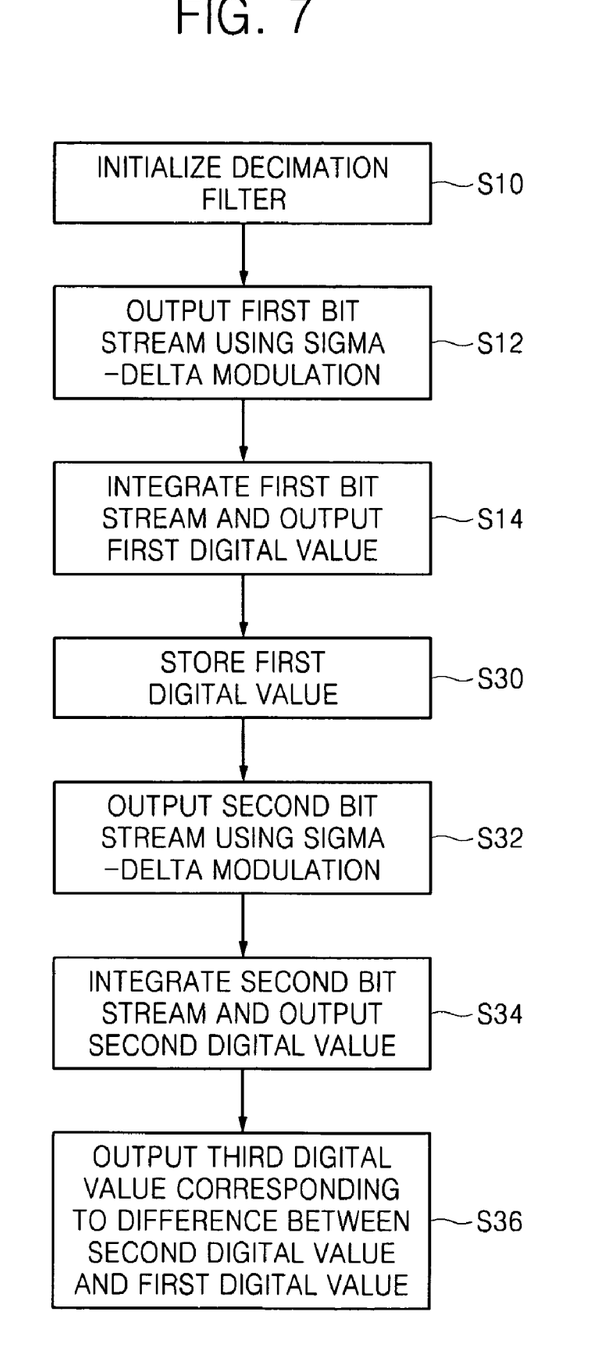
FIG. 7 is a flowchart of the operations of the sigma-delta ADC illustrated in FIG. 4.

FIG. 4 is a block diagram of a sigma-delta ADC 100' according to example embodiments. FIG. 7 is a flowchart of the operations of the sigma-delta ADC 100' illustrated in FIG. 4.

Referring to FIGS. 4 and 7, an integrator 62 included in the decimation filter 61' may be initialized to "0" in response to an initialization signal input from outside the decimation filter 61 in operation S10. The sigma-delta modulator 51 may convert a reset signal output from the pixel unit 21 into a first bit stream BS having a first pattern in operation S12. The integrator 62 included in a decimation filter 61' may integrate the number of bits having a particular value (e.g., 1) in the first bit stream BS, e.g., "0111", output from the sigma-delta modulator 51 and output a first digital value (e.g., 6) in operation S14. The integrator 62 illustrated in FIG. 3 or 4 may integrate the number of bits having another particular value (e.g., 0) in the first bit stream BS.

A memory 66 included in the decimation filter 61' may receive and store the first digital value (e.g., 6) output from the integrator 62 in operation S30. The memory 66 may be separated from an arithmetic circuit 64 in FIG. 4. Alternatively, the memory 66 may be embedded in the arithmetic circuit 64. When the arithmetic circuit 64 includes the memory 66, the arithmetic circuit 64 may receive and store the first digital value output from the integrator 62.

The sigma-delta modulator 51 may convert an image signal output from the pixel unit 21 into a second bit stream BS having a second pattern, e.g., "1110", in operation S32. The integrator 62 of the decimation filter 61' may integrate the number of bits having the particular value (e.g., 1) in the second bit stream BS, e.g., "1110", and output a second digital value (e.g., 9) in operation S34. The arithmetic circuit 64 may output a third digital value (e.g., 3 or a digital value representing 3) corresponding to a difference between the second digital value (e.g., 9 or a digital value representing 9) output from the integrator 62 and the first digital value (6 or a digital value representing 6) stored in the memory 66 in operation S36.

When the bit stream BS output from the sigma-delta modulator 51 is a 1.5-bit stream, the integrator 62 may integrate the number of bits having a particular value (e.g., 1) in the 1.5-bit stream and output a digital value according to the integration result. At this time, the integrator 62 may integrate "11" in the 1.5-bit stream into 2, "01" into 1, and "00" into 0.

For clarity of the description, digital values are represented by decimal numbers, but conversion between decimal numbers and binary representation will be easily understood. According to example embodiments, a sigma-delta ADC may provide higher-resolution digital output signals. In addition, an image pickup device including the sigma-delta ADC may also provide higher-resolution digital output signals.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A sigma-delta analog-to-digital converter comprising:
   a sigma-delta modulator configured to convert a first analog input signal into a first bit stream having a first pattern using sigma-delta modulation and convert a second analog input signal into a second bit stream having a second pattern using sigma-delta modulation; and
   a decimation filter configured to integrate a number of bits having a particular value in the first bit stream, output a first digital value, calculate a bitwise complement value based on the first digital value, set an initial value of a second digital value based on integrating a number of bits having the particular value in the second bit stream with the bitwise complement value of the first digital value, and output the second digital value.

2. The sigma-delta analog-to-digital converter of claim 1, wherein the first analog input signal is a reset signal output from a pixel and the second analog input signal is an image signal output from the pixel.

3. The sigma-delta analog-to-digital converter of claim 1, wherein the particular value is one of a binary value of 0 and a binary value of 1.

4. The sigma-delta analog-to-digital converter of claim 1, wherein the decimation filter includes
   an integrator configured to output the first digital value and the second digital value; and
   a complement value calculation circuit configured to calculate the bitwise complement value from the first digital value output from the integrator,
   wherein the integrator is configured to set the bitwise complement value output from the complement value calculation circuit as the initial value for the second digital value before integrating the number of bits having the particular value in the second bit stream.

5. The sigma-delta analog-to-digital converter of claim 1, wherein the decimation filter is configured to be initialized in response to an initialization signal externally input before integrating the number of bits having the particular value in the first bit stream.

6. The sigma-delta analog-to-digital converter of claim 1, wherein the order of the decimation filter is the same as or greater than the order of the sigma-delta modulator.

7. A sigma-delta analog-to-digital converter comprising:
   a sigma-delta modulator configured to convert a first analog input signal into a first bit stream having a first pattern using sigma-delta modulation and convert a second analog input signal into a second bit stream having a second pattern using sigma-delta modulation; and
   a decimation filter configured to generate a first digital value based on integrating the number of bits having a particular value in the first bit stream, generate a second digital value based on integrating the number of bits having the particular value in the second bit stream, and generate a third digital value based on a difference between the second digital value and the first digital value.

8. The sigma-delta analog-to-digital converter of claim 7, wherein the first analog input signal is a reset signal output from a pixel and the second analog input signal is an image signal output from the pixel.

9. The sigma-delta analog-to-digital converter of claim 7, wherein the decimation filter comprises:
   an integrator configured to generate the first digital value and the second digital value;
   a memory configured to store the first digital value output from the integrator; and
   an arithmetic circuit configured to generate the third digital value based on the difference between the second digital value output from the integrator and the first digital value output from the memory.

10. An image pickup device comprising:
    the sigma-delta analog-to-digital converter of claim 1; and
    a pixel unit comprising a plurality of pixels,
    wherein the first analog input signal is a reset signal output from the pixel unit and the second analog input signal is an image signal output from the pixel unit.

11. The image pickup device of claim 10, wherein the decimation filter is initialized in response to an initialization signal externally input before integrating the number of bits having the particular value in the first bit stream.

12. The image pickup device of claim 10, wherein the decimation filter comprises:
    an integrator configured to output the first digital value and the second digital value; and
    a complement value calculation circuit configured to calculate the bitwise complement value from the first digital value output from the integrator,
    wherein the integrator is configured to set the bitwise complement value output from the complement value calculation circuit as the initial value for the second digital value before integrating the number of bits having the particular value in the second bit stream.

13. An image pickup device comprising:
    the sigma-delta analog-to-digital converter of claim 7; and
    a pixel unit comprising a plurality of pixels,
    wherein the first analog input signal is a reset signal output from the pixel unit and the second analog input signal is an image signal output from the pixel unit.

14. The image pickup device of claim 13, wherein the decimation filter comprises:
    an integrator configured to generate the first digital value and the second digital value;
    a storage circuit configured to store the first digital value output from the integrator; and
    an arithmetic circuit configured to generate the third digital value based on the difference between the second digital value output from the integrator and the first digital value output from the storage circuit.

* * * * *